US009991044B2

(12) United States Patent
Pan et al.

(10) Patent No.: US 9,991,044 B2
(45) Date of Patent: Jun. 5, 2018

(54) ELECTRONIC APPARATUS

(71) Applicant: BOTHHAND ENTERPRISE INC., Tainan (TW)

(72) Inventors: Yung-Ming Pan, Taoyuan (TW); Chung-Cheng Fan, Taoyuan (TW)

(73) Assignee: Bothhand Enterprise Inc., Tainan (TW)

(*) Notice: Subject to any disclaimer, the term of this patent is extended or adjusted under 35 U.S.C. 154(b) by 97 days.

(21) Appl. No.: 15/246,993

(22) Filed: Aug. 25, 2016

(65) Prior Publication Data

US 2017/0301457 A1 Oct. 19, 2017

(30) Foreign Application Priority Data

Apr. 19, 2016 (TW) ............................ 105112082 A

(51) Int. Cl.

| | |
|---|---|
| ***H01F 27/29*** | (2006.01) |
| ***H01F 27/28*** | (2006.01) |
| ***H01F 17/04*** | (2006.01) |
| ***H05K 1/18*** | (2006.01) |
| ***H05K 5/00*** | (2006.01) |

(52) U.S. Cl.
CPC ......... *H01F 27/29* (2013.01); *H01F 27/2823* (2013.01)

(58) Field of Classification Search
CPC ............................ H01F 27/29; H01F 27/2823
USPC ................................ 336/192, 188, 229, 221
See application file for complete search history.

(56) References Cited

U.S. PATENT DOCUMENTS

| | | | | |
|---|---|---|---|---|
| 3,721,747 A * | 3/1973 | Renskers | H01F 27/29 | 174/532 |
| 7,670,183 B2 * | 3/2010 | Huang | H01R 13/6633 | 439/620.05 |
| 7,948,771 B2 * | 5/2011 | Zhang | H05K 5/0091 | 361/809 |
| 2010/0134228 A1 * | 6/2010 | Chow | H01F 27/027 | 336/92 |
| 2011/0095847 A1 * | 4/2011 | Chen | H01F 17/062 | 333/175 |

* cited by examiner

*Primary Examiner* — Elvin G Enad
*Assistant Examiner* — Kazi Hossain
(74) *Attorney, Agent, or Firm* — Muncy, Geissler, Olds & Lowe, P.C.

(57) ABSTRACT

An electronic apparatus includes a base and an electronic module. The base includes first and second base walls, a separating wall connected between the first and second base walls, and two receiving spaces disposed at opposite sides of the separating wall. The electronic module includes a terminal unit, and two electronic units respectively received in the receiving spaces and connected to the terminal unit. The terminal unit includes two pairs of first terminals, each of which has a connecting section protruding from one of two opposite side surfaces of the second base wall, and two second terminals, each of which has two connecting sections respectively protruding from two opposite side surfaces of the first base wall.

6 Claims, 7 Drawing Sheets

ELECTRONIC APPARATUS

CROSS-REFERENCE TO RELATED APPLICATION

This application claims priority of Taiwanese Patent Application No. 105112082, filed on Apr. 19, 2016.

FIELD

The disclosure relates to an electronic apparatus.

BACKGROUND

Referring to FIGS. 1 and 2, a conventional electronic apparatus 1 disclosed in U.S. patent application Ser. No. 14/885,529 includes a base 11, and an electronic module 10 that is mounted to the base 11. The electronic module 10 includes a terminal unit 12, a first electronic unit 13 and a second electronic unit 14. The base 11 includes a surrounding wall 112 that has opposite first and second wall sections 113, 114, and that defines a receiving space 111. The terminal unit 12 includes two first terminals 121 that are mounted to the first wall section 113 of the surrounding wall 112, two second terminals 122 that are mounted to the second wall section 114 of the surrounding wall 112, a first grounding terminal 123 that is mounted to the second wall section 114, a second grounding terminal 124 that is mounted to the first wall section 113, and two connecting terminals 125 that are mounted to the second wall section 114.

The first electronic unit 13 and the second electronic unit 14 are received in the receiving space 111. The first electronic unit 13 includes a first winding core 131, a conducting wire 132 that is wound on the first winding core 131, and a first connecting wire 133 that is wound on the first winding core 131. The conducting wire 132 has two wire sections each connected to a respective one of the first terminals 121 and the second grounding terminal 124. The first connecting wire 133 has two wire sections each connected to a respective one of the connecting terminals 125 and the first grounding terminal 123. The second electronic unit 14 includes a second winding core 141, and two second connecting wires 142 that are wound on the second winding core 141. Each of the second connecting wires 142 is connected to a respective one of the second terminals 122 and a respective one of the connecting terminals 125.

When assembling the conventional electronic apparatus 1, the process of winding the conducting wire 132 and the first connecting wire 133 to the first winding core 131, and the process of winding the second connecting wires 142 to the second winding core 141 can be conducted at the same time, thereby reducing the total amount of time for assembling the conventional electronic apparatus 1. Nonetheless, since all of the first terminals 121, the second terminals 122, the first grounding terminal 123, the second grounding terminal 124 and the connecting terminals 125 protrude from the base 11 in the same direction, it is difficult and time-consuming for a user to connect each wire to the correct terminal.

SUMMARY

Therefore, an object of the present disclosure is to provide an electronic apparatus that can alleviate at least one of the drawbacks associated with the prior art.

According to the present disclosure, an electronic apparatus is adapted to be mounted to a circuit board, and includes a base and at least one electronic module.

The base includes a first base wall that is adapted to be spaced apart from the circuit board in a board connecting direction, a second base wall that is adapted to be disposed between the circuit board and the first base wall, a separating wall that is connected between the first base wall and the second base wall, and two receiving spaces that are respectively disposed at opposite sides of the separating wall along a transverse direction that is perpendicular to the board connecting direction. The first base wall has two first side surfaces that are spaced apart from each other in the transverse direction. The second base wall has two second side surfaces that are spaced apart from each other in the transverse direction.

The electronic module includes a terminal unit and two electronic units. The electronic units are respectively received in the receiving spaces. The terminal unit includes two pairs of first terminals that are respectively mounted to opposite sides of the second base wall of the base opposite to each other in the transverse direction and that are adapted to be electrically connected to the circuit board, and two second terminals that are mounted to the first base wall of the first base. Each of the first terminals has a first connecting section that protrudes from a corresponding one of the second side surfaces of the second base wall. Each of the second terminals has two second connecting sections that respectively protrude from the first side surfaces of the first base wall. Each of the electronic units is electrically connected to the first connecting sections of a corresponding pair of the first terminals, and corresponding ones of the second connecting sections of the second terminals.

BRIEF DESCRIPTION OF THE DRAWINGS

Other features and advantages of the present disclosure will become apparent in the following detailed description of the embodiments with reference to the accompanying drawing, of which.

DETAILED DESCRIPTION

Figure 1:
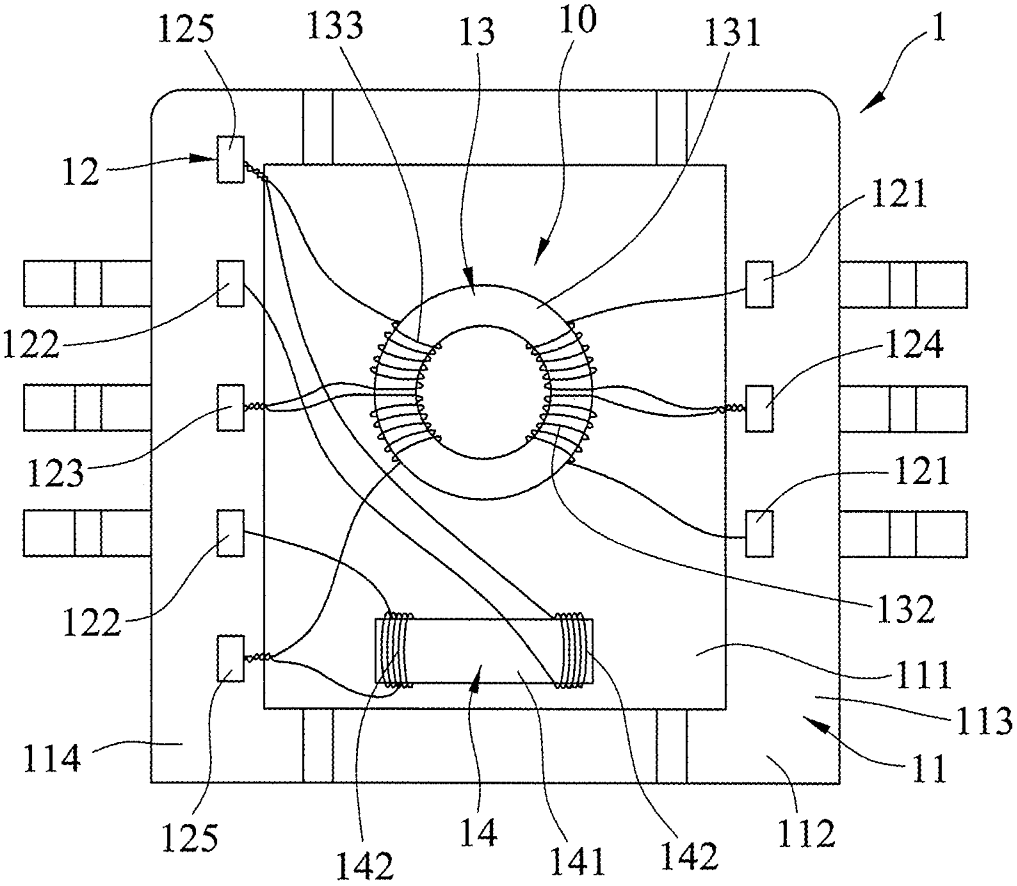
FIG.1 PRIOR ART
FIG. 1 is a top view of a conventional electronic apparatus disclosed in U.S. patent application Ser. No. 14/885,529.
Figure 2:
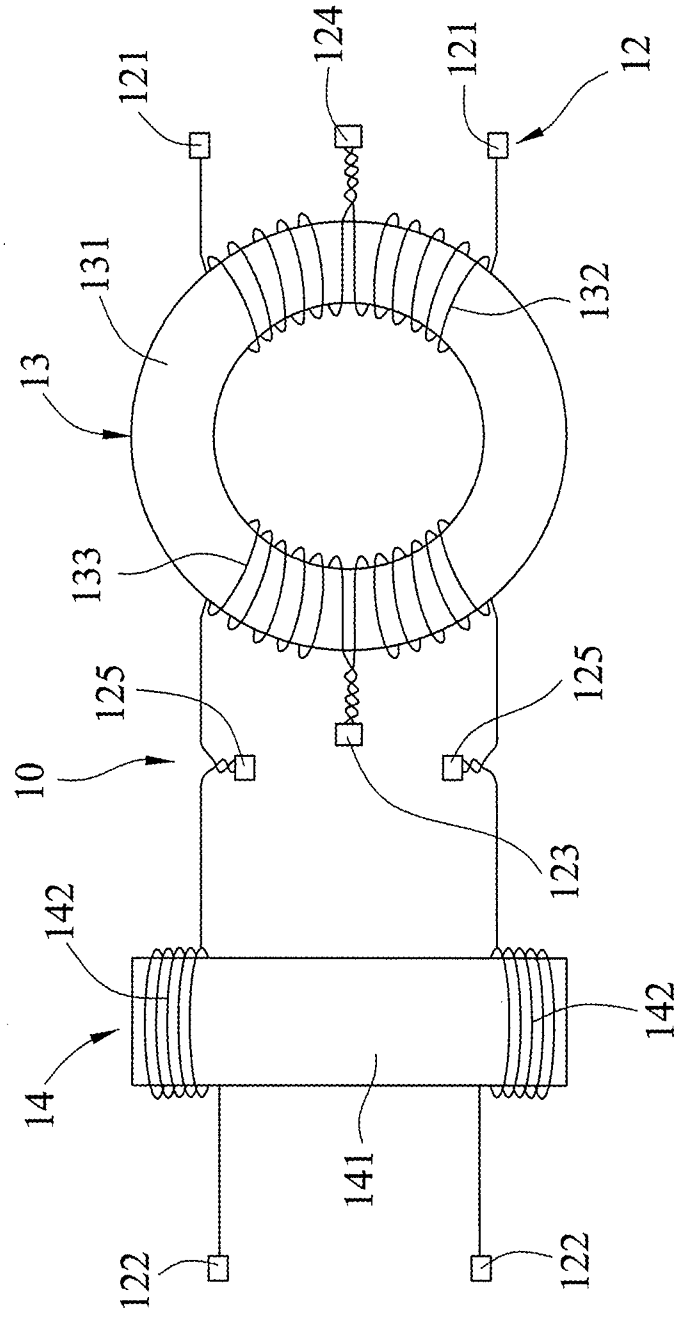
FIG.2 PRIOR ART
FIG. 2 is a schematic view showing the wiring of the conventional electronic apparatus.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 3:
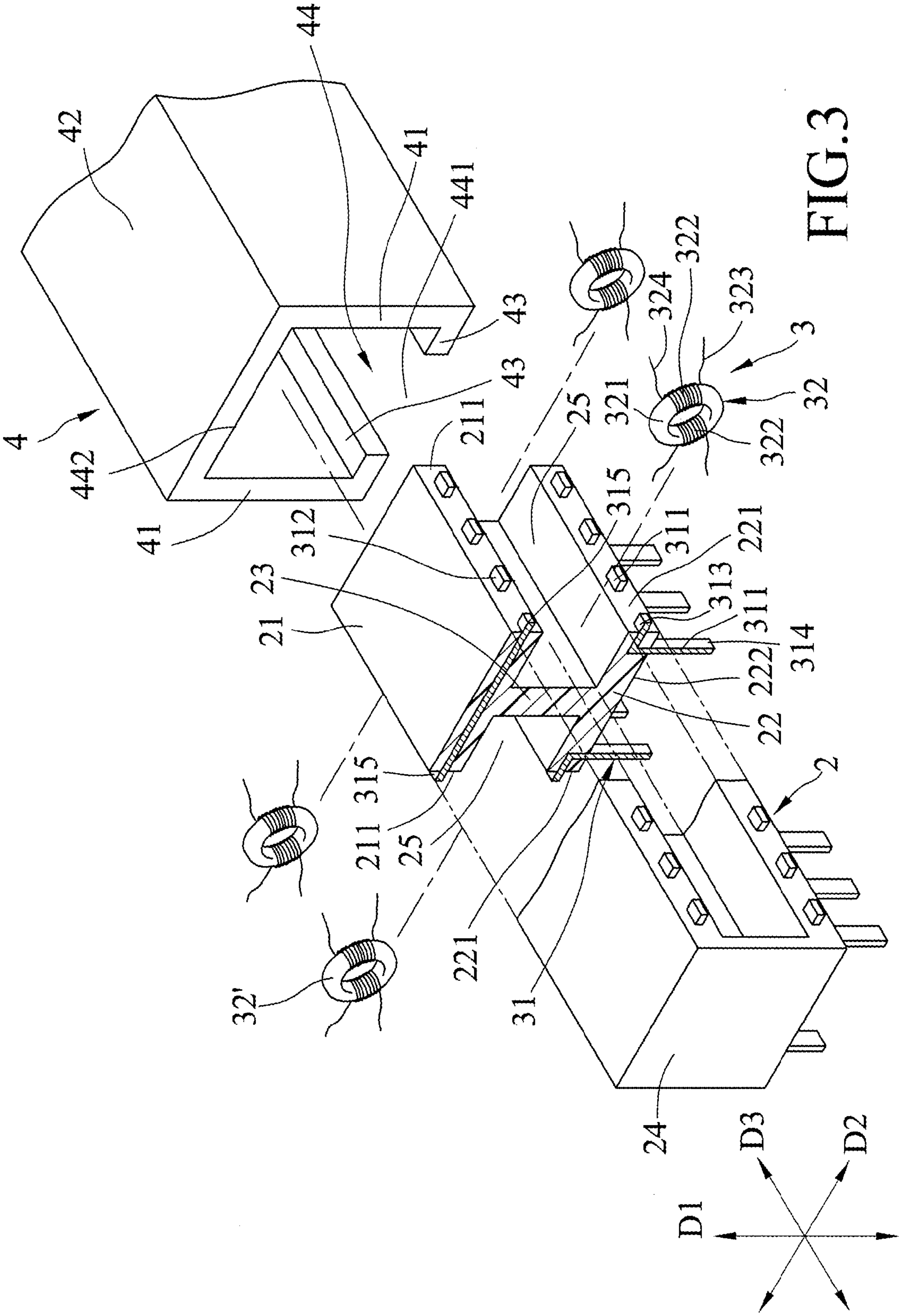
FIG. 3 is a schematic exploded perspective view of a first embodiment of an electronic apparatus according to the present disclosure.
Figure 4:
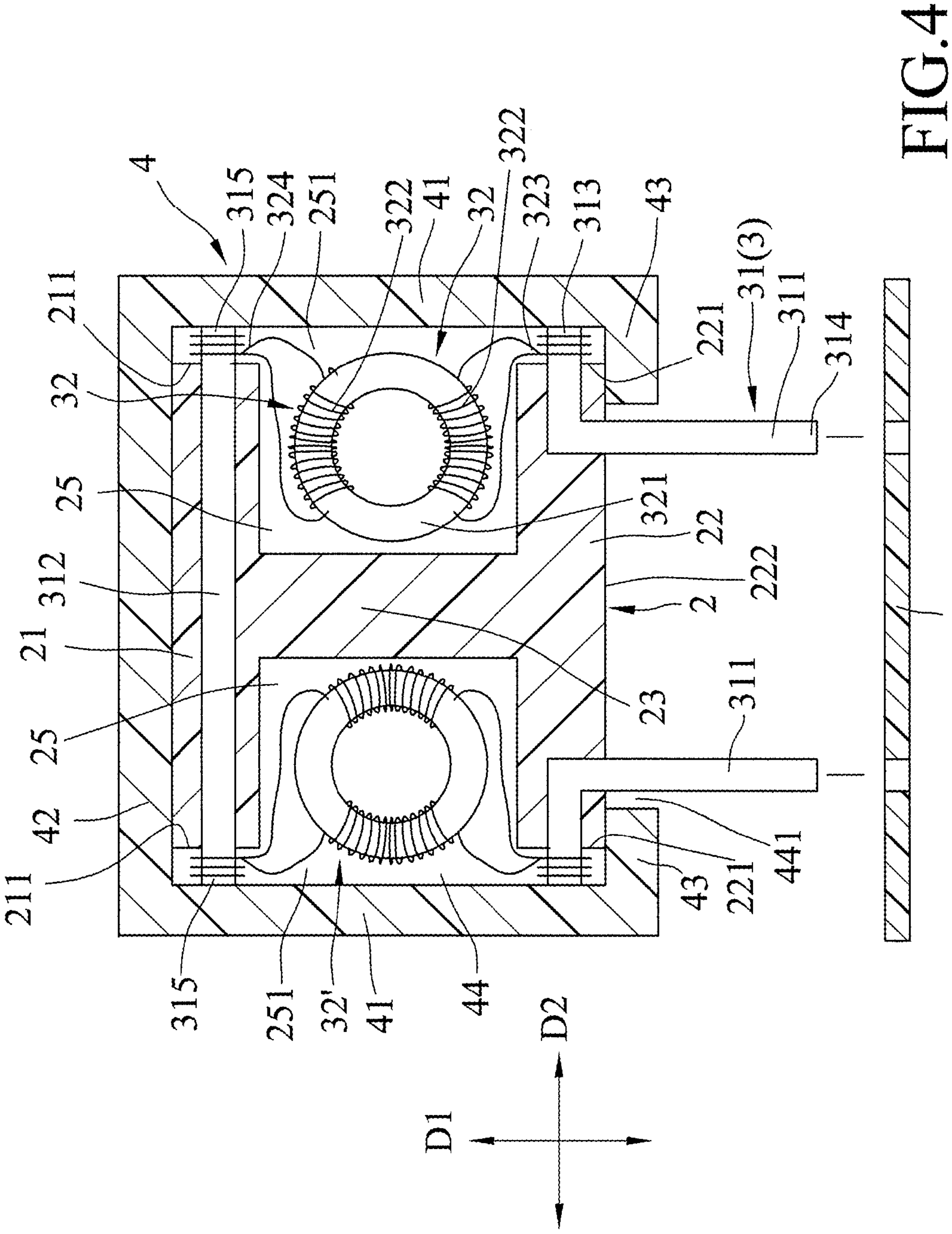
FIG. 4 is a partly sectional view of the first embodiment that is mounted to a circuit board.
Figure 5:
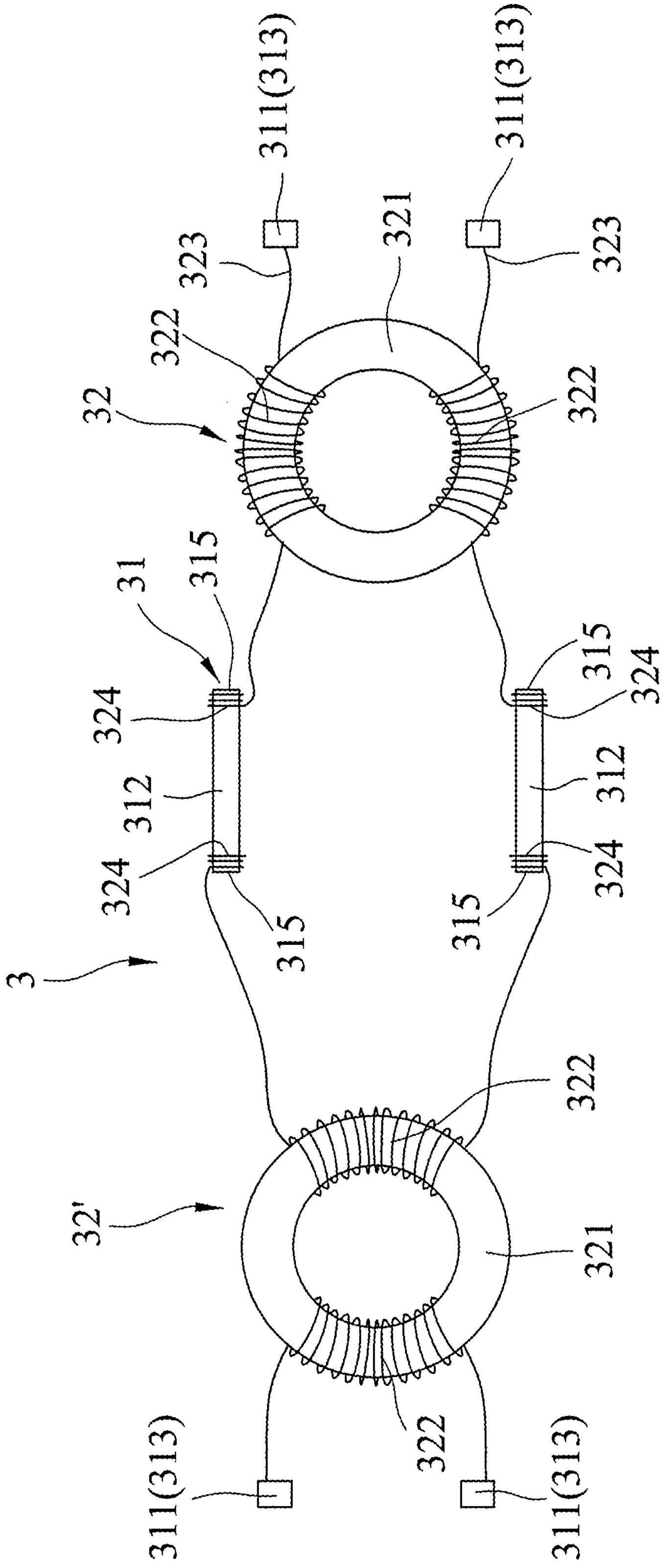
FIG. 5 is a schematic view showing the wiring of the first embodiment.

Referring to FIGS. 3 to 5, a first embodiment of an electronic apparatus according to the present disclosure may be configured to function as a wave filter, a transformer, or a filter-transformer-dual-function apparatus. The different functions can be achieved by changing components of the electronic apparatus, which is well-known in the art, and there fore will not be further elaborated for the sake of brevity.

The first embodiment of the electronic apparatus is adapted to be mounted to a circuit board 9, and includes a base 2, at least one electronic module 3 and an outer cover 4.

In this embodiment, the base 2 is made of an insulating material, is elongated as illustrated in FIG. 3, and extends in a longitudinal direction (D3) . The base 2 includes a rectangular first base wall 21, a rectangular second base wall 22, a rectangular separating wall 23, two receiving spaces 25 and an end sealing wall 24. The first base wall 21 of the base 2 is adapted to be spaced apart from the circuit board 9 in a board connecting direction (D1) that is perpendicular to the longitudinal direction (D3), and is parallel to the circuit board 9. The second base wall 22 of the base 2 is adapted to be disposed between the circuit board 9 and the first base wall 21, and is parallel to the first base wall 21. The separating wall 23 of the base 2 is connected between the first base wall 21 and the second base wall 22. The receiving spaces 25 of the base 2 are respectively disposed at opposite sides of the separating wall 23 along a transverse direction (D2) that is perpendiculars to the board connecting direction (D1) and the longitudinal direction (D3). The end sealing wall 24 of the base 2 is connected to distal ends of the first base wall 21, the second base walls 22 and the separating wall 23. The first wall 21 has two first side surfaces 211 that are spaced apart from each other in the transverse direction (D2). The second base wall 22 has two second side surfaces 221 that are spaced apart from each other in the transverse direction (D2), and a protruding surface 222 that is perpendicularly connected between the second side surfaces 221 and that is adapted to be disposed proximate to the circuit board 9. Each of the second side surfaces 221 of the second base wall 22 is flush with a corresponding one of the first side surfaces 211 of the first wall 21 in the board connecting direction (D1). Each of the receiving spaces 25 has a side opening 251 that is disposed between a corresponding one of the first side surfaces 211 and a corresponding one of the second side surfaces 221, and that extends along the longitudinal direction (D3).

In this embodiment, the electronic apparatus includes a plurality of the electronic modules 3 that are aligned along the longitudinal direction (D3). Since the electronic modules 3 have identical structure, only one electronic module 3 will be described hereinafter for the sake of brevity. The electronic module 3 includes a terminal unit 31 and two electronic units 32, 32'. The electronic units 32, 32' are respectively placed into the receiving spaces 25 through the side openings 251. The terminal unit 31 includes two pairs of first terminals 311 that are respectively mounted to opposite sides of the second base wall 22 of the base 2 opposite to each other and that are adapted to be electrically connected to the circuit board 9, and two second terminals 312 that are mounted into the first base wall 21 of the base 2 along the transverse direction (D2). Each of the first terminals 311 has a first connecting section 313 that protrudes from a corresponding one of the second side surfaces 221 of the second base wall 22, and a mounting section 314 that protrudes from the protruding surface 222 and that is adapted to be electrically connected to the circuit board 9. Each of the second terminals 312 has two second connecting sections 315 that respectively protrude from the first side surfaces 211 of the first base wall 21.

In this embodiment, the electronic apparatus is a through-hole type apparatus, and the mounting section 314 of each of the first terminals 311 is configured to extend along the board connecting direction (D1), and is perpendicular to the circuit board 9. In other embodiments, the electronic apparatus may be a surface-mount type apparatus, and the mounting section 314 of each of the first terminals 311 is configured to extend along the transverse direction (D2), and is parallel to the circuit board 9.

The electronic units 32, 32' may be configured to be different kinds of electronic components base on actual requirements. In this embodiment, the electronic units 32, 32' are configured as electronic coil units. Each of the electronic units 32, 32' is electrically connected to the first connecting sections 313 of a corresponding pair of the first terminals 311, and corresponding ones of the second connecting sections 315 of the second terminals 312. To be more specific, each of the electronic units 32, 32' includes a winding core 321 and two connecting wires 322 that are wound on the winding core 321. Each of the connecting wires 322 of each of the electronic units 32, 32' has a first connecting end 323 that is electrically connected to a corresponding one of the first connecting sections 313 of the first terminals 311, and a second connecting end 324 that is electrically connected to a corresponding one of the second connecting sections 315 of the second terminals 312. It is noted that the electronic units 32, 32' may be configured to function as wave filters or transformers by changing the wiring thereof.

In this embodiment, the outer cover 4 includes two side walls 41 extending in the board connecting direction (D1), a connecting wall 42 connected between the side walls 41 in the transverse direction (D2), and two clamping walls 43 respectively protruding from the side walls 41 and extending toward each other. The side walls 41 cooperate with the connecting wall 42 and the clamping walls 43 to define a containing space 44 that receives the base 2 and the electronic module 3. The containing space 44 has an end opening 442 and a bottom opening 441 that is disposed between the clamping walls 43. The mounting section 314 of each of the first terminals 311 extends through the bottom opening 441. The end sealing wall 24 of the base 2 closes the end opening 442 of the containing space 44.

Figure 6:
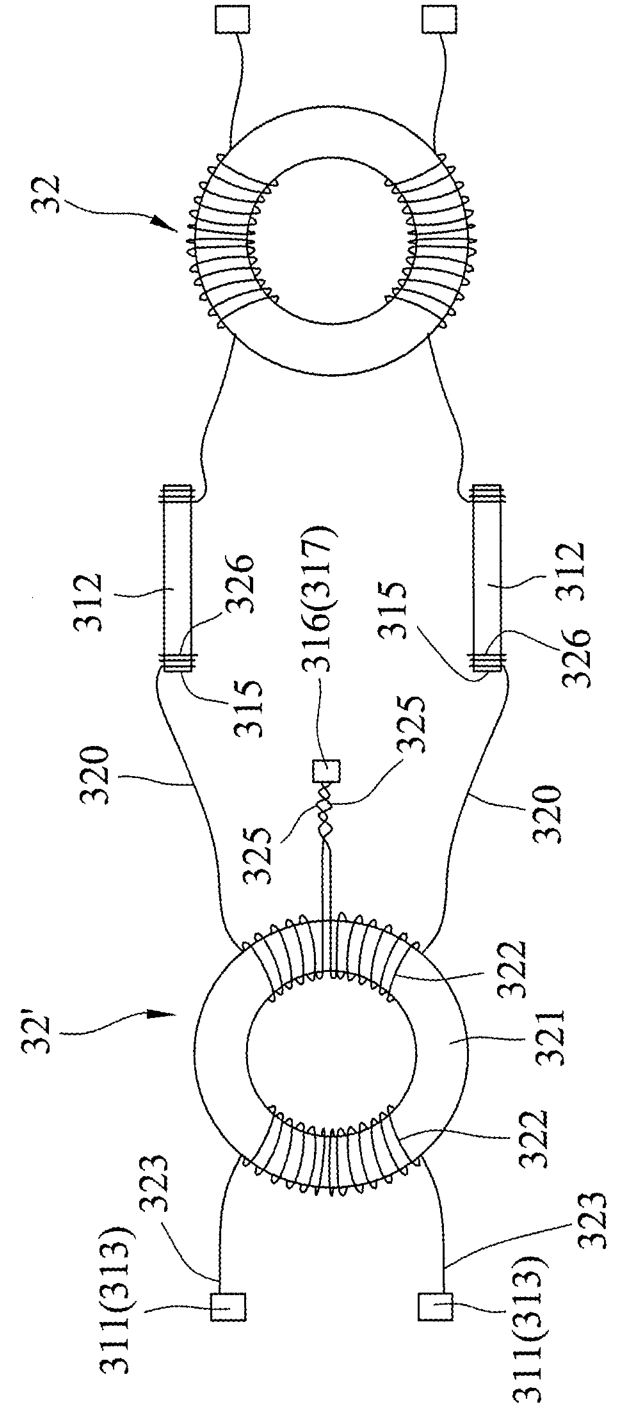
FIG. 6 is a schematic view showing the wiring of a second embodiment of the electronic apparatus according to the present disclosure.
Figure 7:
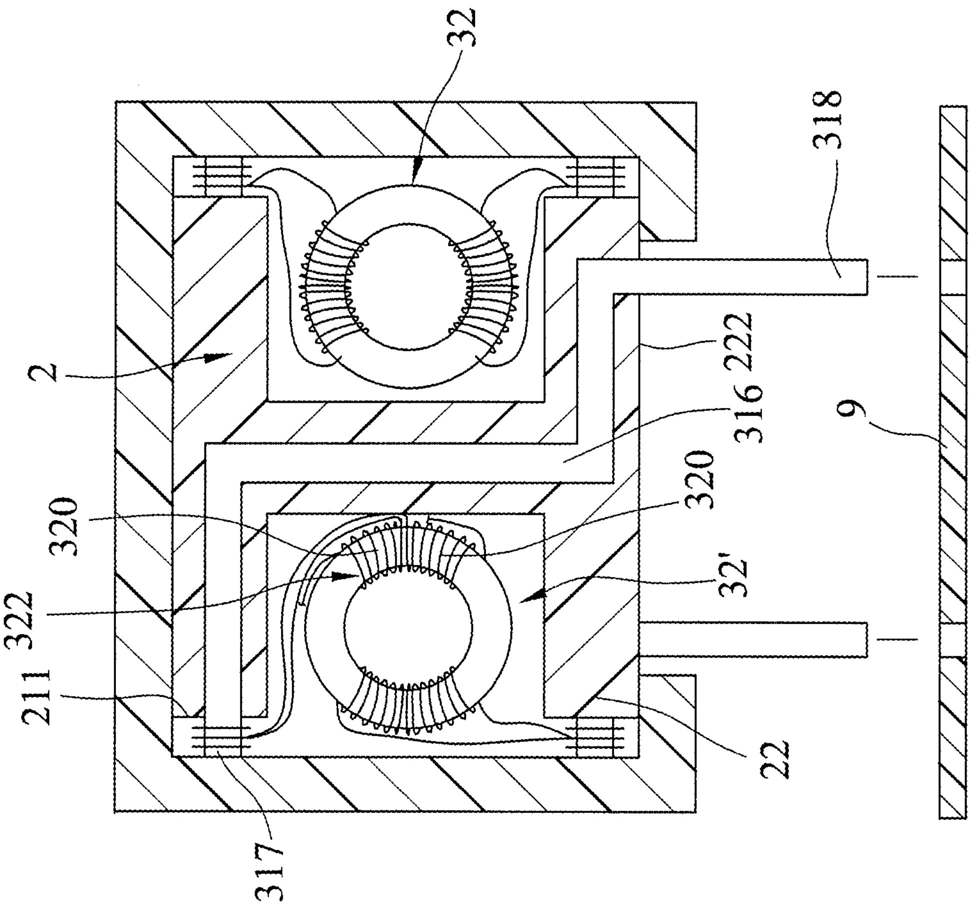
FIG. 7 is a partly sectional view of the second embodiment that is mounted to a circuit board.

Referring to FIGS. 6 and 7, a second embodiment of the electronic apparatus of the present disclosure has a structure similar to that of the first embodiment, except that the second embodiment is configured to have a function of grounding. In the second embodiment, the terminal unit 31 further includes a grounding terminal 316 that is mounted to the base 2 and that includes first and second grounding sections 317, 318 protruding from the base 2. The second grounding section 318 of the grounding terminal 316 is adapted to be electrically connected to the circuit board 9. In this embodiment, the first grounding section 317 of the grounding terminal 316 protrudes from a corresponding one of the first side surfaces 211 of the first base wall, and the second grounding section 318 protrudes from the protruding surface 222 of the second base wall 22. In this embodiment, one of the connecting wires 322 of the electronic unit 32' has two wire sections 320, each of which has a third connecting end 325 that is electrically connected to the first grounding section 317 of the grounding terminal 316, and a fourth connecting end 326 that is electrically connected to a corresponding one of the second connecting sections 315 of the second terminals 312.

To Sum up, since the electronic units 32, 32' are respectively received in the receiving spaces 25 that are respectively disposed at opposite sides of the separating wall 23 along the transverse direction (D2), and since the connecting sections of the terminals protrude from two sides of the base 2, it is convenient for a user to connect each wire to a corresponding one of the terminals, thereby increasing manufacturing efficiency and reducing the possibility of incorrect connection.

In the description above, for the purposes of explanation, numerous specific details have been set forth in order to provide a thorough understanding of the embodiment (s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is (are) considered the exemplary embodiment (s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. An electronic apparatus adapted to be mounted to a circuit board, and comprising:

a base including a first base wall that is adapted to be spaced apart from the circuit board in a board connecting direction, a second base wall that is adapted to be disposed between the circuit board and said first base wall, a separating wall that is connected between said first base wall and said second base wall, and two receiving spaces that are respectively disposed at opposite sides of said separating wall along a transverse direction that is perpendicular to the board connecting direction, said first base wall having two first side surfaces that are spaced apart from each other in the transverse direction, said second base wall having two second side surfaces that are spaced apart from each other in the transverse direction; and at least one electronic module including a terminal unit and two electronic units, said electronic units being respectively received in said receiving spaces, said terminal unit including two pairs of first terminals that are respectively mounted to opposite sides of said second base wall of said base opposite to each other in the transverse direction and that are adapted to be electrically connected to the circuit board, and two second terminals that are mounted to said first base wall of said base, each of said first terminals having a first connecting section that protrudes from a corresponding one of said second side surfaces of said second base wall, each of said second terminals having two second connecting sections that respectively protrude from said first side surfaces of said first base wall, each of said electronic units being electrically connected to said first connecting sections of a corresponding pair of said first terminals, and corresponding ones of said second connecting sections of said second terminals.

2. The electronic apparatus as claimed in claim 1, wherein said second base wall further has a protruding surface that is connected between said second side surfaces and that is adapted to be disposed proximate to the circuit board, each of said first terminals further having a mounting section that protrudes from said protruding surface and that is adapted to be electrically connected to the circuit board.

3. electronic apparatus as claimed in claim 2, further comprising an outer cover that includes two side walls extending in the board connecting direction, a connecting wall connected between said side walls in the transverse direction, and two clamping walls respectively protruding from said side walls and extending toward each other, said side walls cooperating with said connecting wall and said clamping walls to define a containing space that receives said base and said electronic module.

4. The electronic apparatus as claimed in claim 3, wherein said containing space has an end opening and a bottom opening that is disposed between said clamping walls, said mounting section of each of said first terminals extending through said bottom opening, said base further including an end sealing wall that is connected to said first base wall, said second base wall and said separating wall, and that closes said end opening of said containing space.

5. The electronic apparatus as claimed in claim 1, wherein each of said electronic units includes a winding core and two connecting wires that are wound on said winding core, each of said connecting wires of each of said electronic units having a first connecting end that is electrically connected to a corresponding one of said first connecting sections of said first terminals, and a second connecting end that is electrically connected to a corresponding one of said second connecting sections of said second terminals.

6. The electronic apparatus as claimed in claim 1, wherein each of said electronic units includes a winding core and two connecting wires that are wound on said winding core, said terminal unit further including a grounding terminal that is mounted to said base and that includes first and second grounding sections protruding from said base, said second grounding section of said grounding terminal being adapted to be electrically connected to the circuit board, one of said connecting wires of one of said electronic units having two wire sections, each of which has a third connecting end that is electrically connected to said first grounding section of said grounding terminal, and a fourth connecting end that is electrically connected to a corresponding one of said second connecting sections of said second terminals.

* * * * *